United States Patent [19]

Williams et al.

[11] Patent Number: 5,162,646

[45] Date of Patent: * Nov. 10, 1992

[54] RADIATION-CONTROLLED FILTER WITH PHOTOCONDUCTOR MEANS AND FEEDBACK THERETO

[75] Inventors: Bruce H. Williams, Sandy, Utah; Valjean P. Snyder, West Valley City, Utah; Patrick S. Grant, Sunnyvale, Calif.

[73] Assignee: Unisys Corp., Detroit, Mich.

[*] Notice: The portion of the term of this patent subsequent to Apr. 7, 2009 has been disclaimed.

[21] Appl. No.: 718,089

[22] Filed: Jun. 19, 1991

Related U.S. Application Data

[63] Continuation of Ser. No. 367,404, Jun. 15, 1989, Pat. No. 5,103,084.

[51] Int. Cl.$^5$ .................................... H01J 40/14
[52] U.S. Cl. ............................. 250/214 R; 250/551; 330/59
[58] Field of Search ............... 250/551, 214 R, 205; 330/59, 308, 305, 306; 307/311

[56] References Cited

U.S. PATENT DOCUMENTS

| | | | |
|---|---|---|---|
| 3,772,514 | 11/1973 | Sunderland | 250/552 |
| 3,940,715 | 2/1976 | Lum | 330/59 |
| 4,568,886 | 2/1986 | English | 330/303 |

Primary Examiner—David C. Nelms
Assistant Examiner—Que T. Le
Attorney, Agent, or Firm—John J. McCormack; Mark T. Starr

[57] ABSTRACT

Embodiments disclose an adjustable filter (cf voltage-controlled bandwidth) having photoconductors whose resistance is adjusted by variable-intensity radiation source means, with a related feedback loop to compensate for thermal changes.

7 Claims, 1 Drawing Sheet

RADIATION-CONTROLLED FILTER WITH PHOTOCONDUCTOR MEANS AND FEEDBACK THERETO

This is a continuation of application Ser. No. 07/367,404, filed Jun. 15, 1989, now U.S. Pat. No. 5,103,084.

This invention relates to filter circuits and particularly those of the analog, voltage-controllable-bandwidth type.

BACKGROUND, FEATURE OF INVENTION

In the past, workers adjusted a (low-pass) filter bandwidth by discretely switching resistor values; e.g. with digitally controlled switches. Alternatively, one could use a digital filter arrangement; however, this method required switchable clock frequencies.

Workers are aware that it would be advantageous to better control the bandwidth of a low-pass filter, especially if this could be done in continuous fashion over several decades of frequency; e.g. a range of 100 Hz to 10 KHz would be very useful.

Thus, a feature of this invention is to provide techniques for controlling a low-pass filter's bandwidth—more particularly to use photoconductive means as variable filter impedance means, and to set resistor values by controlling radiation intensity illuminating the photoconductive elements.

And an added feature is to provide an associated matched voltage-controlled radiation source. The output radiation intensity of such a source may be controlled according to a variable input control voltage—this control voltage thus acting to set the bandwidth of the filter.

A related feature is to provide such in a circuit array including a "control loop" which compensates for temperature variation of the light source particularly when the control loop comprises a source regulated voltage and a photoconductor optically linked to the mentioned radiation source so as to be stimulated thereby—to thereby modulate the "control voltage" so as to compensate for temperature variations: Thus, a "temperature-compensating control loop".

In a particular preferred embodiment, a pair of photoconductors are used to set the bandwidth of a two-pole active filter which is responsive to light output from an LED source. The LED source is, in turn, controlled by a control voltage source, CVS. In the CVS, the control voltage is selected to give the prescribed LED output and to consequently adjust the resistance of the photoconductors used in the filter. Preferably, this LED also irradiates a third "reference" photoconductor which is arranged in a feedback control loop to compensate for any temperature-induced output variation in the LED.

Thus, it is an object to address at least some of these concerns and teach ways of ameliorating them. A particular object is to teach the use of photoconductors as variable impedance means in a filter circuit, these being impedance-adjusted by variable illumination means, this, in conjunction with a control loop to compensate for thermal variations. A related object is to do this to yield an analog, voltage-controllable bandwidth, two-pole, active, low-pass filter wherein the bandwidth may be continuously controlled, and varied, over more than two decades of frequency, simply by adjusting a control voltage—using appropriate photoconductors for the filter resistors, and preferably also using a stabilizing photoconductor means in a temperature-compensating feedback loop. A related object is to provide this as part of a continuously-variable, data-aided demodulator.

BRIEF DESCRIPTION OF THE DRAWING

These and other features and advantages of the present invention will be appreciated by workers as they become better understood by reference to the following detailed description of the present preferred embodiments which should be considered in conjunction with the accompanying drawing:

The Figure simplified schematic circuit diagram of one preferred embodiment:

Figure 1:
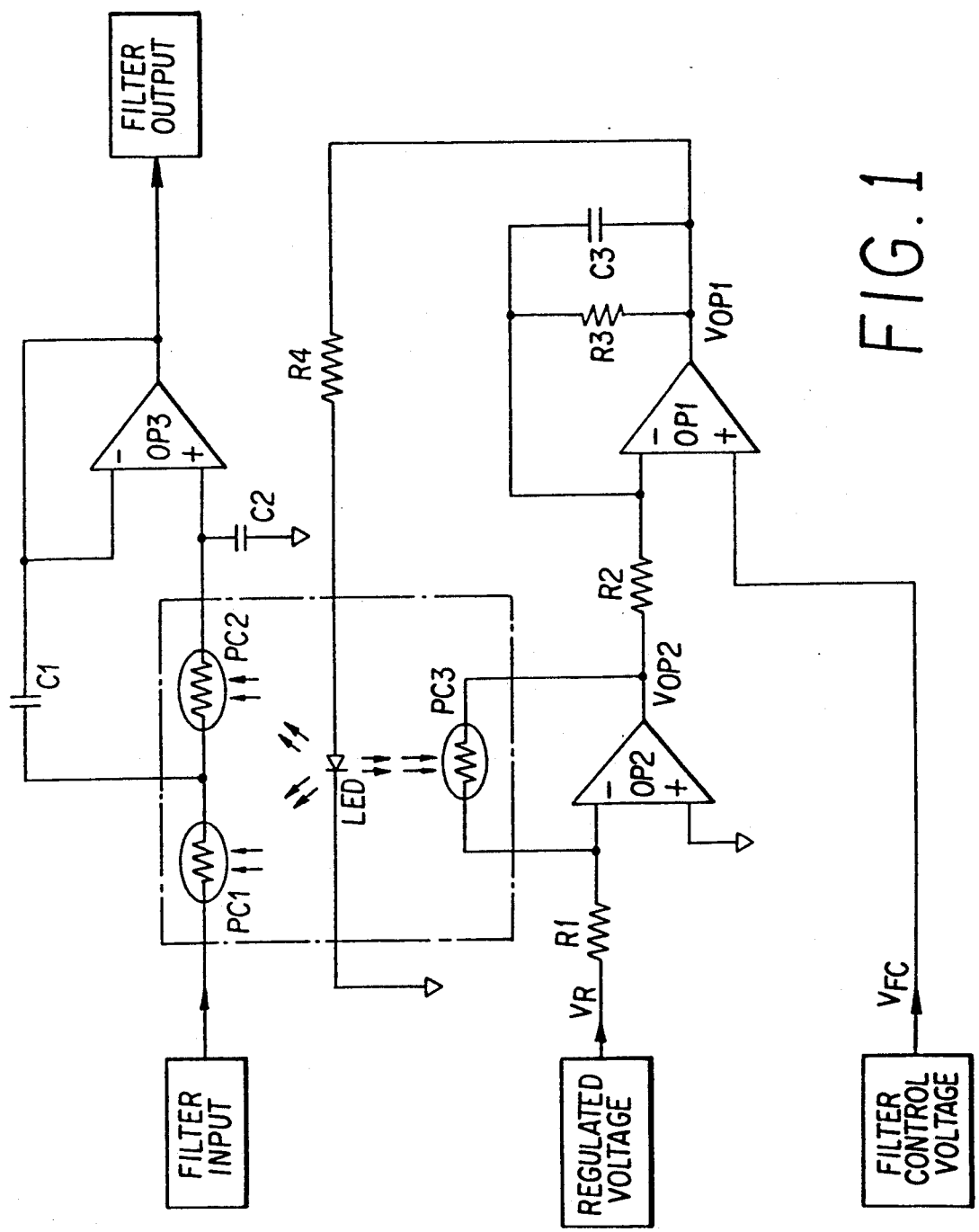

The invention will be better appreciated by workers upon consideration of the following detailed description of some preferred embodiments.

DESCRIPTION OF PREFERRED EMBODIMENT

General description, background

The embodiment illustrates a filter circuit particularly adapted for use with a continuously-variable, data-aided demodulator.

This, and other means discussed herein, will generally be understood as selected, formulated, and operating as presently known in the art, except where otherwise specified. And, except as otherwise specified, all materials, methods, and devices and apparatus herein will be understood as implemented by known expedients according to present good practice.

The figure shows a preferred embodiment: a voltage-controllable, two-pole, low-pass filter wherein two such photoconductors are used to provide a prescribed active low-pass filter between the indicated Input and Output terminals.

These photo-conductors, PC1 and PC2, are intended to vary their resistance in response to the level of a certain related source of filter-control-voltage, $V_{fc}$. Source $V_{fc}$ is fed to a light-emitting diode (LED), optically coupled to photoconductors PC1 and PC2. The result is that a given voltage level at Source $V_{fc}$ will cause a given light output from the LED and so induce a given resistance level in PC1 and PC2 as known in the art. Thus, PC1, PC2, and the LED are housed in an appropriate optically-isolated container (indicated by the dotted lines) as known in the art.

Preferably, the filter characteristics produced are a function of R (the resistance of PC1 and PC2 are each R) and the capacitors used (C1 and C2) as workers will recognize. The transfer function is listed in the figure.

Workers will recognize that this embodiment may be varied to use a single photo-conductor in combination with a single capacitor to make a continuous, voltage-controlled, passive, "single-pole filter". Two photoconductors are necessary in the given configuration, since one must be used with a feedback control circuit.

Enhancement for Error Compensation:

Preferably, the configuration displayed in the figure is optimized to include an optical feedback arrangement adapted to compensate for variations in LED output, induced by temperature change or like sources of error. Thus, as indicated in the figure, this may be implemented in a feedback loop, optically coupling a third (stabilizing) photoconductor, PC3, to the LED (enclosed in the same optical container) and providing an appropriate related reference voltage source and related circuitry to compensate for such changes.

A temperature-stable, reference voltage, $V_R$, is amplified by an operational amplifier (OP2). The output of OP2, ($V_{OP2}$) is a function of R (the resistance of PC3), $R_1$, and $V_R$;

$$V_{OP2} = -(R/R_1)*V_R.$$

The operational amplifier OP1 amplifies and averages an error voltage ($V_{FC}-V_{OP2}$). The amplified and averaged output, $V_{OP1}$, adjusts the current into the LED ($I_{LED}=V_{OP1}/R4$).

The intensity of light out of the LED is roughly proportional to the current through the LED; the resistances of PC1, PC2, and PC3 are function of light intensity. Therefore, the feedback control loop is closed. Since the error voltage is minimized by $V_{OP1}$, the resistance of PC3 (and consequently PC1 and PC2) goes to whatever value necessary to make $V_{OP2}$ approximate $V_{FC}$. The result is that, as $V_{FC}$ is changed, the resistance of PC1, PC2, and PC3 are linearly scaled.

In effect, the third (stabilizing) photoconductor, PC3, will give a temperature-stable light output from the LED and so provide temperature-stability for the photoconductors used (PC1, PC2) in the two-pole, low-pass filter. The end result is a temperature-insensitive filter.

Results

Thus, the resistance of one or several filter photoconductors can be radiation-controlled via a variable radiation-source, this source being controlled by a prescribed variable control voltage; e.g. to enable the circuit to change filter bandwidth by factors of 100 to 1000. Such circuit can be advantageously used in a "continuously-variable, BPSK, data-aided demodulator", as workers will appreciate.

The preferred components in FIG. 1 are as follows:
PC1, PC2, PC3: Cadmium Sulfide Cells
LED: Any LED to which the Cadmium Sulfide Cells will react
OP1, OP2, OP3: Any standard Op-Amps
$V_R$, $V_{FC}$: Created from temperature insensitive regulators.

Thus, it will be seen that the described embodiment provides an analog voltage-controlled bandwidth, two-pole, active, low-pass filter wherein the bandwidth may be continuously controlled, and varied, over more than two decades of frequency, simply by adjusting a control voltage—using appropriate photoconductors for the filter resistors and preferably also using a stabilizing photoconductor means in a temperature-compensating feedback loop, to thereby offset temperature-induced variances.

Conclusion

It will be understood that the preferred embodiments described herein are only exemplary, and that the invention is capable of many modifications and variations in construction, arrangement and use without departing from the spirit of what is claimed.

For example, the means and methods disclosed herein are also applicable for other related filters. Also, the invention is applicable for providing filter means for other communication systems, as workers will realize.

The above examples of possible variations of the present invention are merely illustrative. Accordingly, the present invention is to be considered as including all possible modifications and variations coming within the scope of the invention as defined by the appended claims.

What is claimed is:

1. A method of arranging a variable-bandwidth filter circuit to be adjustable according to radiation-output from a prescribed radiation source means, this method comprising:
   providing said Source means arranged and adapted to exhibit variable radiation levels;
   providing Photoconductor means, as filter resistor means whose resistance is controllable to yield said bandwidth variation according to said radiation levels, the Photoconductor means being optically coupled to said Source means.

2. The invention of claim 1 wherein said Source means is controlled by a prescribed Control Voltage means to so vary its intensity.

3. The invention of claim 2 wherein said Source means comprises LED means and said Control-Voltage means is to compensate for ambient Error Conditions.

4. An adjustable filter demodulator arrangement including a photoconductor stage whose resistance is variable with received radiation intensity; variable-intensity radiation source means for providing such radiation of intensity apt for so varying the resistance of said photoconductor stage; filter input means arranged and adapted to apply prescribed signals to said photoconductor stage; filter output means arranged and adapted to accept said signals filtered by said stage and present them to utilization means, an optical feedback arrangement adapted to compensate for variations in the radiation of the source means; said source means including LED means which is optically coupled to said photoconductor means, as well as to other compensatory photoconductor means in a feedback loop adapted to so adjust the output of the LED means; and
   an appropriate related reference voltage stage included to so adjust the LED output and thus regulate filter resistance despite such error conditions; this
   reference voltage stage including operational amplifier means arranged and adapted to amplify, and average, an error voltage applied to adjust current to the LED, with the compensatory photoconductor means thus regulating the LED to provide a temperature-stable light output for said photoconductor stage;
   the characteristics of said recited elements being arranged to yield a filter whose bandwidth is temperature stable, and is adjustable by 100× to 1000×.

5. An adjustable filter arrangement comprising a photo-conductor stage for responding to variable radiation source means and related continuously-variable photo-conductor means for yielding a bandwidth variation according to radiation output levels for automatically correcting the output of said radiation source means in response to prescribed error conditions, being coupled therewith in feedback relation.

6. A continuously-variable data-aided demodulator including an adjustable filter arrangement comprising a photo-conductor stage for responding to radiation source means and related continuously-variable photo-conductor means for yielding a bandwidth variation according to radiation output levels for automatically correcting the output of said radiation source means in response to prescribed error condition, being coupled therewith in feedback relation.

7. The invention of claim 6 wherein the filter arrangement bandwidth is temperature-stable and is adjustable by 100× to 1000×.

* * * * *